(12) United States Patent
Berens et al.

(10) Patent No.: US 12,489,453 B2
(45) Date of Patent: Dec. 2, 2025

(54) SAR ADC WITH BOTTOM-PLATE SAMPLING AND MISMATCH ERROR SHAPING

(71) Applicant: NXP B.V., Eindhoven (NL)

(72) Inventors: Michael Todd Berens, Austin, TX (US); Alphons Litjes, Zijtaart (NL); Erik Olieman, Waalre (NL)

(73) Assignee: NXP B.V., Eindhoven (NL)

( * ) Notice: Subject to any disclaimer, the term of this patent is extended or adjusted under 35 U.S.C. 154(b) by 147 days.

(21) Appl. No.: 18/384,823

(22) Filed: Oct. 27, 2023

(65) Prior Publication Data

US 2025/0141457 A1    May 1, 2025

(51) Int. Cl.
*H03M 1/06* (2006.01)
(52) U.S. Cl.
CPC ................................. *H03M 1/0604* (2013.01)
(58) Field of Classification Search
CPC ..... H03M 1/0604; H03M 1/066; H03M 1/468
See application file for complete search history.

(56) References Cited

U.S. PATENT DOCUMENTS

| 7,868,795 | B2 | 1/2011 | Berens et al. | |
|---|---|---|---|---|
| 9,559,716 | B1* | 1/2017 | Matsui | H03M 1/1061 |
| 10,243,577 | B1* | 3/2019 | Berens | H03M 1/1042 |
| 10,958,282 | B2 | 3/2021 | Olieman et al. | |
| 11,424,754 | B1 | 8/2022 | Berens | |
| 2013/0088375 | A1 | 4/2013 | Wu et al. | |
| 2020/0343901 | A1 | 10/2020 | Etou | |
| 2021/0313997 | A1 | 10/2021 | Alpman et al. | |

FOREIGN PATENT DOCUMENTS

EP    3716487 A1    9/2020

OTHER PUBLICATIONS

Huang Wei-Hsiang et al: "An Amplifier-Less Calibration-Free SAR ADC Achieving >100dB SNDR for Multi-Channel ECG Acquisition with 667mVpp Linear Input Range", 2019 Symposium on VLSI Circuits, JSAP, Jun. 9, 2019, pp. 1-2.
Leene Lieuwe B et al: "A 68[mu]W 31kS/s Fully-Capacitive Noise-Shaping SAR ADC with 102 dB SNDR", 2019 IEEE International Symposium on Circuits and Systems (ISCAS), IEEE, May 26, 2019, pp. 1-5.

(Continued)

*Primary Examiner* — Omer S Khan

(57) ABSTRACT

A SAR ADC includes a DAC, a comparator and SAR circuitry, where the DAC includes MSBs encoded with first capacitors; a mismatch error shaping capacitor coupled to the MSBs; LSBs encoded with second capacitors, where a first switch set couples bottom capacitor plates of the first capacitors and the mismatch error shaping capacitor to receive an analog input voltage, a high reference voltage, or a low reference voltage in response to first DAC feedback control signals, wherein a second switch set couples bottom capacitor plates of the second capacitors to receive the high reference voltage or the low reference voltage in response to second DAC feedback control signals, and wherein the SAR circuitry is configured to feedback a mismatch error value from a previous SAR conversion cycle to the LSBs sub-DAC during a current sampling cycle.

21 Claims, 7 Drawing Sheets

(56) References Cited

OTHER PUBLICATIONS

Sun Jie et al: "Attenuation-factor error shaping technique for split CDAC in SAR ADCs", Electronics Letters, the Institution of Engineering and Technology, GB, vol. 56, No. 8, Apr. 16, 2020, pp. 369-371.
Yun-Shiang Shu et al: "An Oversampling SAR ADC With DAC Mismatch Error Shaping Achieving 105 dB SFDR and 101 dB SNDR Over 1 kHz BW in 55 nm CMOS", IEEE Journal of Solid-State Circuits, vol. 51, No. 12, Dec. 2016, pp. 2928-2940.
Zhang Huajun et al: "A 1-V 560-nW SAR ADC With 90-dB SNDR for IoT Sensing Applications", IEEE Transactions on Circuits and Systems II: Express Briefs, IEEE, USA, vol. 66, No. 12, Dec. 2019, pp. 1967-1971.
Michael Todd Berens, U.S. Appl. No. 17/662,009, filed May 4, 2022, entitled Analog-to-Digital Converter (ADC) Having Calibration.
Hanyue Li et al., 7.3-µW 13-ENOB 98-dB SFDR Noise-Shaping SAR ADC With Duty-Cycled Amplifier and Mismatch Error Shaping, IEEE Journal of Solid-State Circuits, vol. 57, No. 7, Jul. 2022.
Chuanshi Yang et al., A 98.6 dB SNDR SAR ADC With a Mismatch Error Shaping Technique Implemented With Double Sampling, IEEE Transactions on Circuits and Systems—II: Express Briefs, vol. 69, No. 3, Mar. 2022.
Kazunori Hasebe et al., 100kHz-Bandwidth 98.3dB-SNDR Noise-Shaping SAR ADC with Improved Mismatch Error Shaping and Speed-Up Techniques, 2022 Symposium on VLSI Technology & Circuits Digest of Technical Papers, (VLSI Technology and Circuits), Honolulu, HI, USA, 2022, pp. 56-57, doi: 10.1109/VLSITechnologyandCir46769.2022.9830166.
Yuting Shen et al., 103-dB SFDR Calibration-Free Oversampled SAR ADC With Mismatch Error Shaping and Pre-Comparison Techniques, IEEE Journal of Solid-State Circuits, 57(3), 734-744. [9663409]. https://doi.org/10.1109/JSSC.2021.3135559, Jan. 3, 2022.
Chuanshi Yang et al., An Area-Efficient SAR ADC With Mismatch Error Shaping Technique Achieving 102-dB SFDR 90.2-dB SNDR Over 20-kHz Bandwidth, IEEE Transactions on Very Large Scale Integration (VLSI) Systems, col. 29, No. 8, Aug. 2021.
Jiaxin Liu et al., Error-Feedback Mismatch Error Shaping for High-Resolution Data Converters, IEEE Transactions on Circuits and Systems—I: Regular Papers, vol. 66. No. 4, Apr. 2019.
Xiyuan Tang et al., Low-Power SAR ADC Design: Overview and Survey of State-of-the-Art Techniques, IEEE Transactions on Circuits and Systems—I: Regular Papers, vol. 69, No. 6, Jun. 2022.
Hanyue Li et al., An 80dB-SNDR 98dB-SFDR Noise-Shaping SAR ADC with Duty-Cycled Amplifier and Digital-Predicted Mismatch Error Shaping, IEEE 47th European Solid State Circuits Conference (ESSCIRC), Grenoble, France, 2021, pp. 387-390, doi: 10.1109/ESSCIRC53450.2021.9567748.
Jiaxin Liu et al., Noise-Shaping SAR ADCs, Chapter 2, Jan. 2020.
Haoyu Zhuang et al., A Second-Order Noise-Shaping SAR ADC with Passive Integrator and Tri-Level Voting, IEEE Journal of Solid-State Circuits, Jun. 2019, doi: 10.1109/JSSC.2019.2900150.

\* cited by examiner

SAR ADC WITH BOTTOM-PLATE SAMPLING AND MISMATCH ERROR SHAPING

BACKGROUND OF THE INVENTION

Field of the Invention

The present disclosure is directed in general to electrical circuitry for data conversion. In one aspect, the present disclosure relates generally to analog-to-digital converter (ADC) systems.

Description of the Related Art

In electronics, an analog-to-digital converter (ADC, A/D, or A-to-D) is a system that converts an analog signal into a digital signal. Successive approximation register (SAR) ADCs are a widely-employed type of analog-to-digital converter that offers low power, medium speed, moderate-to-high resolution, minimal active analog circuit, small die size, low latency and high reusability. In operation, an SAR ADC converts a continuous analog waveform into a discrete digital representation via a binary search. For example, a 12-bit SAR ADC converts an analog input voltage into a 12-bit binary representation. The SAR ADC operates using a binary search principle where the ADC makes a decision for each bit of resolution to converge to a digital output for each analog-to-digital conversion. A SAR ADC includes a digital-to-analog converter ("DAC") and a comparator connected in a feedback loop with SAR logic. The DAC may be formed of an array of binary-weighted elements, such as capacitors and/or resistors. In CMOS implementations, DACs are typically implemented with capacitor arrays because, for a given area, capacitors feature less mismatch errors, faster settling time and less current consumption than resistors, allowing for higher resolutions, higher speed and lower power. Each binary-weighted element corresponds to a binary digit of a corresponding binary representation. To generate a 12-bit binary representation, the DAC may include twelve binary-weighted elements and a dummy or termination element, but the DAC may also use other weighting schemes for elements, such as non-radix-2 or unary or combinations of weighting schemes.

During an analog-to-digital conversion, the SAR ADC uses a sampling phase to sample an input voltage at the DAC, and during a comparison phase, the DAC elements are used to successively approximate the input voltage. At each successive approximation step, the comparator output is stored at output registers by the SAR logic as a digital word that provides the digital representation of the analog input voltage.

While SAR ADCs provide good performance up to about 12 bits, there are significant limitations beyond 12 bits where the DAC element matching and comparator and pre-amplifier noise can impair the signal-to-(noise+distortion) ("SNDR") performance. In addition, there are other performance limitations with existing DACs which have reduced input range and/or gain errors that can degrade SNDR performance. Oversampling techniques can only improve ADC accuracy and reduce SNDR losses from DAC element matching if dynamic element matching is used, but because of the logic complexity and costs, dynamic element matching (DEM) is rarely used on more than the 4-5 most significant bits.

As seen from the foregoing, the existing SAR ADC solutions for quickly and efficiently performing analog-to-digital conversions are extremely difficult at a practical level by virtue of the difficulty balancing the design constraints for providing an efficient, low complexity SAR ADC with the performance demands for performing high speed analog-to-digital conversion. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description of a preferred embodiment is considered in conjunction with the following drawings.

DETAILED DESCRIPTION

A system, apparatus, and methodology are described for a bottom-plate sampling successive approximation register (SAR) analog-to-digital converter (ADC) having a digital-to-analog converter (DAC) component formed with a multi-bit capacitor array, where an extra capacitor at a designated position in the multi-bit capacitor array is used to enable mismatch error shaping (MES) on the less significant capacitors in the multi-bit capacitor array. Providing the extra capacitor allows MES by replacing the LSBs for sampling the input voltage which frees up the LSBs for sampling and switching Vrefh or Vrefl as required for MES. In selected embodiments, the bottom-plate sampling DAC component is implemented as a segmented DAC and the extra capacitor is added to the most significant bits (MSB) section of the segmented DAC so that mismatch error shaping can be performed on the less significant bit section(s) while dynamic element matching or calibration techniques can be performed on the MSB section. In other embodiments, the bottom-plate sampling DAC component is a non-segmented DAC and the extra capacitor at a designated position in the multi-capacitor array is sized to have a value that is the sum of the termination capacitor and all the less significant capacitors so that mismatch error shaping can be performed on the less significant bit capacitors while dynamic element matching or calibration techniques can be performed on the extra capacitor and the more significant capacitors. In addition to enabling mismatch error shaping of the less significant bits, the extra capacitor may also be used to recover the lost input range caused by the mismatch error shaping by using the extra bit during the SAR phase as essentially a redundant bit that is equivalent to the sum of the termination capacitor and all the less significant capacitors being used for MES. As will be appreciated, if a segmented DAC does not sample the input voltage on the LSB array, the termination capacitor is not required.

Figure 1:
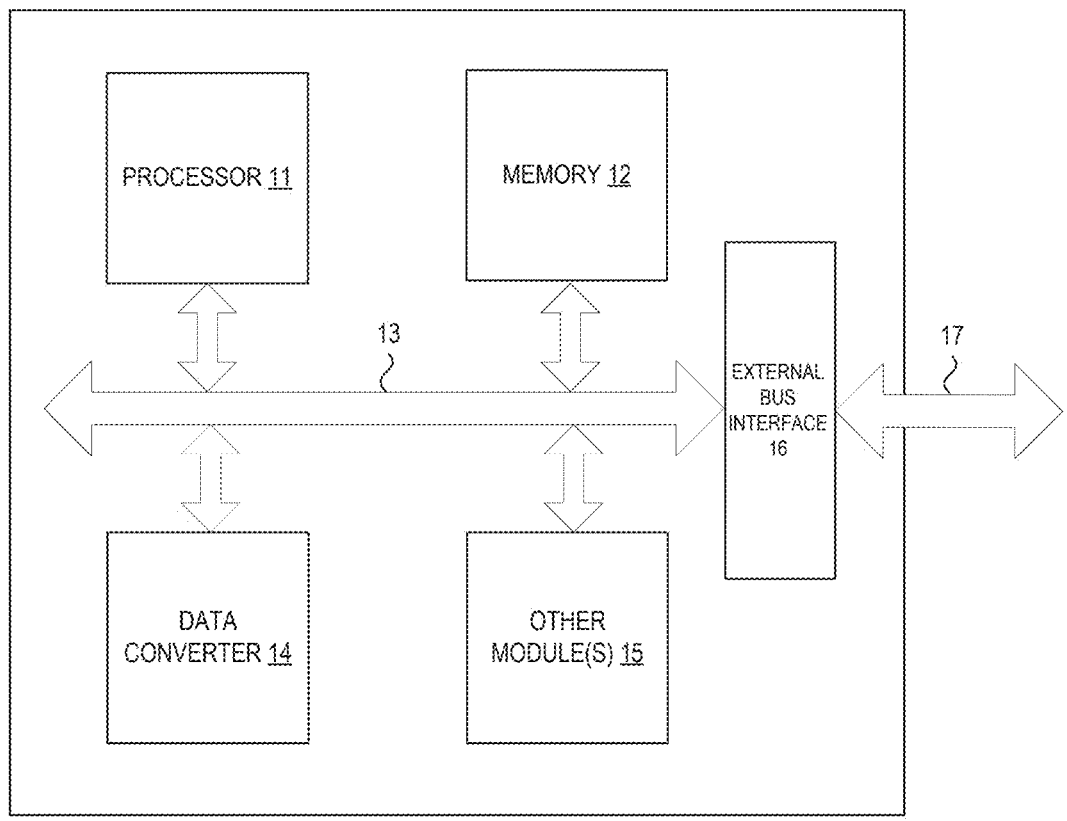
FIG. 1 depicts a simplified block diagram of a microcontroller computer system in accordance with selected embodiments of the present disclosure.

Reference is now made to FIG. 1 which depicts a simplified block diagram of a microcontroller computer system 10 in accordance with selected embodiments of the present disclosure. As depicted, the microcontroller computer system 10 includes one or more processors 11 and a memory 12 connected over a bi-directional bus 13 to a data converter 14, one or more other modules 15, and external bus interface 16. As will be appreciated, the microcontroller computer system 10 can receive inputs and provide outputs by way of a bus 17 or a plurality of electrical signals 17 coupled to external bus interface 16. In other embodiments, the microcontroller computer system 10 may include fewer, more, or different blocks of circuitry than those illustrated in FIG. 1. As disclosed herein, the microcontroller computer system 10 may be implemented with a single integrated circuit, with plurality of integrated circuits, or as a combination of integrated circuits and discrete components.

Figure 2:
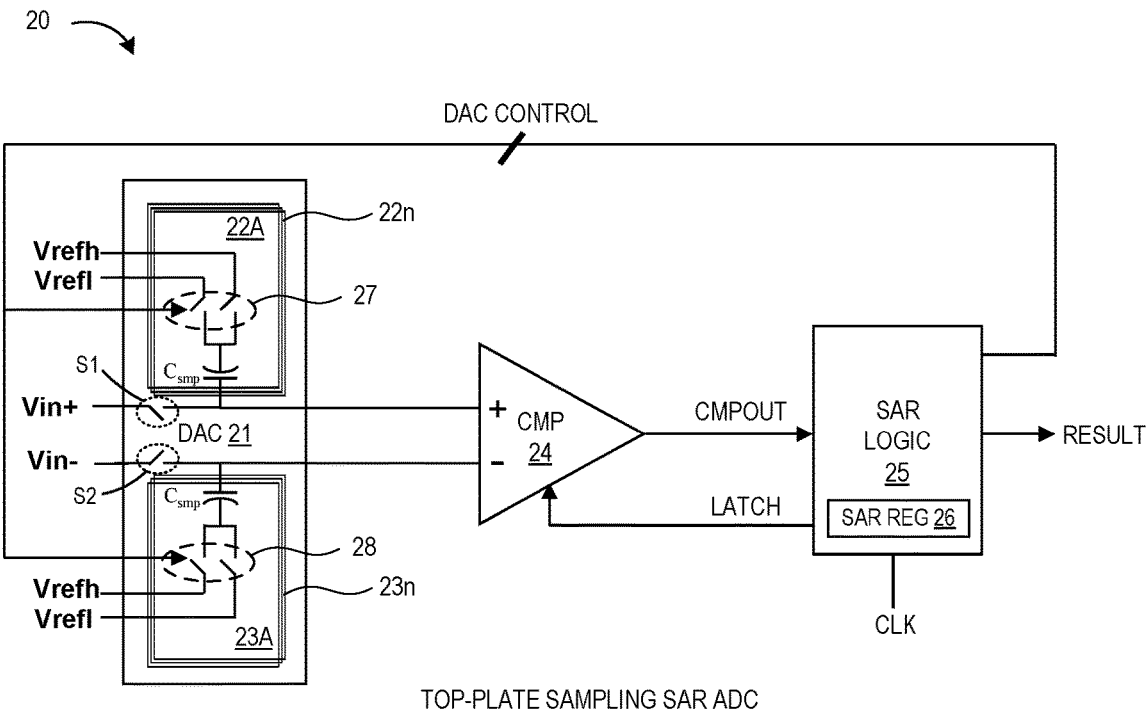
FIG. 2 depicts a schematic block diagram of a top-plate sampling SAR ADC.

To provide a contextual understanding for the present disclosure, reference is now made to FIG. 2 which depicts a schematic block diagram of a SAR ADC 20 that performs top plate sampling of a received differential voltage input signal (Vin+, Vin−). The disclosed SAR ADC 20 includes a digital-to-analog converter (DAC) 21 and a comparator 24 connected in a feedback loop with digital SAR logic block 25 which executes a binary search algorithm to provide an n-bit DAC feedback control signal to the DAC 21. The depicted DAC 21 includes first and second sampling arrays 22, 23 of capacitor elements. As depicted, each of the sampling arrays 22, 23 may include a capacitive sampling circuit (e.g., capacitors 22A-n, 23A-n) wherein a sampling capacitor Csmp has a top plate connected to the voltage input signal and a bottom plate connected to either a high reference voltage Vrefh or a low reference voltage Vrefl using the connection switches 27, 28 that are controlled by the DAC control values (DAC CONTROL) generated by the SAR logic block 25. Other embodiments may use any type of charge redistribution array for data conversion. In addition, alternate embodiments may use any desired and appropriate elements (e.g., resistive elements, capacitive elements, a combination thereof, etc.).

The SAR ADC 20 has a first-differential-input-terminal that receives a first-differential-input-signal (Vin+), which in this example is a positive-differential-input-signal. The SAR ADC 20 also includes a second-differential-input-terminal that receives a second-differential-input-signal (Vin−), which in this example is a negative-differential-input-signal.

The first-differential-input-terminal is connected to a positive-input-terminal of the comparator 24 by a first-sampling-switch S1. In this way, the first-sampling-switch S1 can selectively connect or disconnect the first-differential-input-terminal to the comparator 24 (and also to a plurality of first-sampling-capacitors Csmp in the first capacitive sampling array 22A-n, as will be discussed below). When the first-sampling-switch S1 is closed, the circuit samples the first-differential-input-signal (Vin+). When the first-sampling-switch S1 is open, the circuit converts the sampled value of the first-differential-input-signal (Vin+). Also connected to the positive-input-terminal of the comparator 24 is the first capacitive sampling array 22A-n. More particularly, the analog output signal from the first capacitive sampling array 22A-n is provided to the positive-input-terminal of the comparator 24.

In a similar way, the second-differential-input-terminal is connected to a negative-input-terminal of the comparator 24 by a second-sampling-switch S2. In this way, the second-sampling-switch S2 can selectively connect or disconnect the second-differential-input-terminal to the comparator 24 (and also to a plurality of second-sampling-capacitors Csmp in the second capacitive sampling array 23A-n, as will be discussed below). When the second-sampling-switch S2 is closed, the circuit samples the second-differential-input-signal (Vin−). When the second-sampling-switch S2 is open, the circuit converts the sampled value of the second-differential-input-signal (Vin−). Also connected to the negative-input-terminal of the comparator 24 is the second capacitive sampling array 23A-n. More particularly, the analog output signal from the second capacitive sampling array 23A-n is provided to the negative-input-terminal of the comparator 24.

The comparator 24 has a comparator-output-terminal CMPOUT that is connected to an input of the digital SAR logic block 25. At each step of the approximation, the digital SAR logic block 25 stores the comparator output CMPOUT in the SAR register 26 in response to the LATCH signal. The digital SAR logic block 25 also processes the comparator output signal CMPOUT in order to generate a DAC Control feedback signal DAC CONTROL that provides DAC control values that are representative of an n-bit digital word for supplying as a control to the first capacitive sampling array 22A-n and second capacitive sampling array 23A-n in the DAC 21. In addition, the digital SAR logic block 25 generates a latch feedback signal LATCH that is provided to latch the comparator 24. The digital SAR logic block 25 also generates an output signal (RESULT) that provides a digital representation of the differential input voltage signal Vin+, Vin−. The digital SAR logic block 25 also generates the ADC-output-signal (RESULT) that is representative of the digital code at an end of the analog-to-digital conversion, again as known in the art of SAR ADCs.

The DAC 21 includes a first capacitive sampling array 22A-n having a plurality of first-sampling-capacitors Csmp. Each first sampling capacitor Csmp is connected over a top capacitor plate to the positive-input-terminal of the comparator 24. In addition, each first sampling capacitor Csmp is connected over a bottom capacitor plate to a connection switch 27 which is controlled by the DAC CONTROL feedback signal from the digital SAR logic block 25 so that the bottom capacitor plate receives a respective reference voltage Vrefh, Vrefl that represents a bit value of the digital word that is provided by the digital SAR logic block 25.

The DAC 21 also includes a second capacitive sampling array 23A-n having a plurality of second-sampling-capacitors Csmp. Each second sampling capacitor Csmp is connected over a top capacitor plate to the negative-input-terminal of the comparator 24. In addition, each second sampling capacitor Csmp is connected over a bottom capacitor plate to a connection switch 28 which is controlled by the DAC CONTROL feedback signal from the digital SAR logic block 25 so that the bottom capacitor plate receives a respective reference voltage Vrefh, Vrefl that represents a bit value of the digital word that is provided by the digital SAR logic block 25.

The SAR ADC 20 performs top plate sampling of the received differential signaling because the first-differential-input-signal (Vin+) and the second-differential-input-signal (Vin−) are connected to the top plates of the sampling-capacitors Csmp in the first and second capacitive sampling array 22A-n, 23A-n. As will be appreciated, there are advantages and disadvantages with performing top-plate sampling of the differential input signaling (Vin+, Vin−) on the SAR ADC 20. One advantage of top-plate sampling is that fewer switches are required than for bottom-plate sampling (described hereinbelow). The primary disadvantage of top-plate sampling is that the unit capacitors Csmp and inputs to the comparator 24 create top-plate parasitic capacitance which reduces the input range. In addition, top plate parasitic capacitors introduce a gain error which can become non-linear if the parasitics are non-linear. In addition, the sampling switch for top-plate sampling capacitors is prone to input-voltage dependent clock feedthrough and charge-injection effects.

Figure 3:
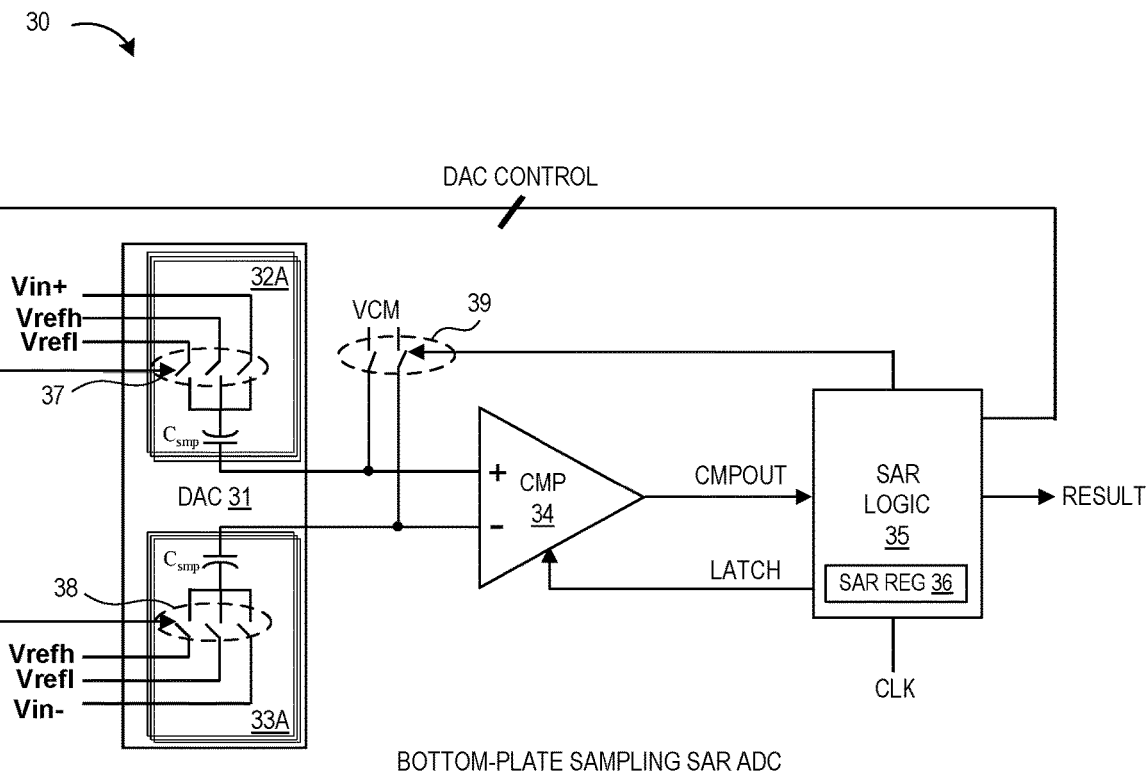
FIG. 3 depicts a schematic block diagram of a bottom-plate sampling SAR ADC.

To provide a contextual understanding for the present disclosure, reference is now made to FIG. 3 depicts a schematic block diagram of a SAR ADC 30 that performs bottom plate sampling of a received differential voltage input signal (Vin+, Vin−). The disclosed SAR ADC 30 includes a digital-to-analog converter (DAC) 31 and a comparator 34 connected in a feedback loop with digital SAR logic block 35 which executes a binary search algorithm to provide an n-bit DAC feedback control signal to the DAC 31. To the extent that features of FIG. 3 have already been described with reference to corresponding features in FIG. 2, they will not necessarily be described again here.

The depicted DAC 31 includes first and second sampling arrays 32, 33 of elements. As depicted, each of the sampling arrays 32, 33 may include a capacitive sampling circuit (e.g., capacitors 32A-n, 33A-n) wherein a sampling capacitor Csmp has a top plate connected to the comparator 34 and a bottom plate connected via connection switch 37 to either the voltage input signal, a high reference voltage Vrefh, or a low reference voltage Vrefl under control of the DAC control values (DAC CONTROL) generated by the SAR logic block 35. Other embodiments may use any type of charge redistribution array for data conversion. Again, alternate embodiments may use any desired and appropriate elements (e.g., resistive elements, capacitive elements, a combination thereof, etc.).

Instead of connecting the differential input signals (Vin+, Vin−) directly to the comparator 34, the SAR ADC 30 has a first-differential-input-terminal at the first capacitive sampling array 32A-n that receives a first-differential-input-signal (Vin+), which in this example is a negative-differential-input-signal. In turn, the first-differential-input-signal (Vin+) is connected over a tri-state connection switch 37 to a bottom plate of a sampling capacitor Csmp which has a top plate connected directly to a positive-input-terminal of the comparator 34. The tri-state connection switch 37 is also connected to receive the reference voltages Vrefh, Vrefl. As a result, the tri-state connection switch 37 can selectively connect the bottom plate of each of a plurality of first-sampling-capacitors Csmp to either: (i) the first-differential-input-terminal or (ii) a respective one of the reference voltages Vrefh, Vrefl.

The SAR ADC 30 also includes a second-differential-input-terminal at second capacitive sampling array 33A-n that receives a second-differential-input-signal (Vin−), which in this example is a positive-differential-input-signal. In turn, the second-differential-input-signal (Vin−) is connected over a tri-state connection switch 38 (also referred to as a three-way switch) to a bottom plate of a sampling capacitor Csmp which has a top plate connected directly to a negative-input-terminal of the comparator 34. The tri-state connection switch 38 is also connected to receive the reference voltages Vrefh, Vrefl. As a result, the tri-state connection switch 38 can selectively connect the bottom plate of each of a plurality of second-sampling-capacitors Csmp to either: (i) the second-differential-input terminal or (ii) a respective one of the reference voltages Vrefh, Vrefl.

The positive-input-terminal of the comparator 34 is connected to a common mode voltage (VCM) by a sampling switch 39 which can selectively connect or disconnect the comparator 34 (and also the sampling capacitors Csmp in the first capacitive sampling array 32A-n) to VCM. Similarly, the negative-input-terminal of the comparator 34 is connected to the common mode voltage (VCM) by the sampling switch 39 which can selectively connect or disconnect the comparator 34 (and also the sampling capacitors Csmp in the second capacitive sampling array 33A-n) to VCM.

As will be appreciated, the SAR ADC 30 is in a sampling-state-of-operation when the tri-state connection switches 37, 38 respectively connect the bottom plates of each of the sampling capacitors Csmp in the first and second capacitive sampling arrays 32A-n, 33A-n to the first differential input terminal (Vin+) and the second differential input terminal (Vin−) while the sampling switch 39 connects the positive and negative input terminals of the comparator 24 to VCM. In addition, the SAR ADC 30 is in a conversion-state-of-operation when the tri-state connection switches 37, 38 respectively connect the bottom plates of each of the sampling capacitors Csmp in the first and second capacitive sampling arrays 32A-n, 33A-n to a respective one of the reference voltages Vrefh, Vrefl while the sampling switch 39 disconnects the positive and negative input terminals of the comparator 24 from VCM. In this arrangement, the SAR ADC 30 performs bottom plate sampling of the received differential signaling because the first-differential-input-signal (Vin+) and the second-differential-input-signal (Vin−) are connected to the bottom plates of the sampling capacitors Csmp in the first and second capacitive sampling arrays 32A-n, 33A-n.

In the depicted configuration, the comparator 34 has a comparator-output-terminal CMPOUT that is connected to an input of the digital SAR logic block 35. At each step of the approximation, the digital SAR logic block 35 stores the comparator output CMPOUT in the SAR register 36 in response to the LATCH signal. The digital SAR logic block 35 also processes the comparator output signal CMPOUT in order to generate a DAC Control feedback signal DAC CONTROL that provides DAC control values that are representative of an n-bit digital word for supplying as a control to the first capacitive sampling array 32A-n and second capacitive sampling array 33A-n in the DAC 31. In addition, the digital SAR logic block 35 generates a latch feedback signal LATCH that is provided to latch the comparator 34. The digital SAR logic block 35 also generates an output signal (RESULT) that provides a digital representation of the differential input voltage signal Vin−, Vin+. The digital SAR logic block 35 also generates the ADC-output-signal (RESULT) that is representative of the digital code at an end of the analog-to-digital conversion, again as known in the art of SAR ADCs.

The SAR ADC 30 performs bottom plate sampling of the received differential signaling because the first-differential-input-signal (Vin+) and the second-differential-input-signal (Vin−) are connected to the bottom plates of the sampling-capacitors Csmp in the first and second capacitive sampling array 32A-n, 33A-n. As will be appreciated, there are advantages and disadvantages with performing bottom-plate sampling of the differential input signaling (Vin+, Vin−) on the SAR ADC 30. While requiring more switches than for top-plate sampling, bottom-plate sampling avoids the parasitic capacitance issue and allows for full input range without gain error (or with very low gain error). Bottom-plate sampling also avoids the input-voltage-dependent clock-feedthrough and charge injection associated with shutting off the sample switch. However, for both top-plate sampling and bottom-plate sampling SAR ADCs, linearity of the capacitor array in the DAC is a major limiting factor since oversampling techniques are only effective for reducing noise, but not for eliminating distortion caused by any nonlinearity in the capacitor array. Trace parasitic and unit capacitance mismatch are two factors that affect linearity. Ideally, the nonlinear error introduced by trace parasitic in capacitor array can be solved through perfect circuit and layout design, but perfection is not always achievable. Unit capacitance mismatch is also a difficult problem to solve because it is related to process accuracy parameters and capacitance size.

Figure 4:
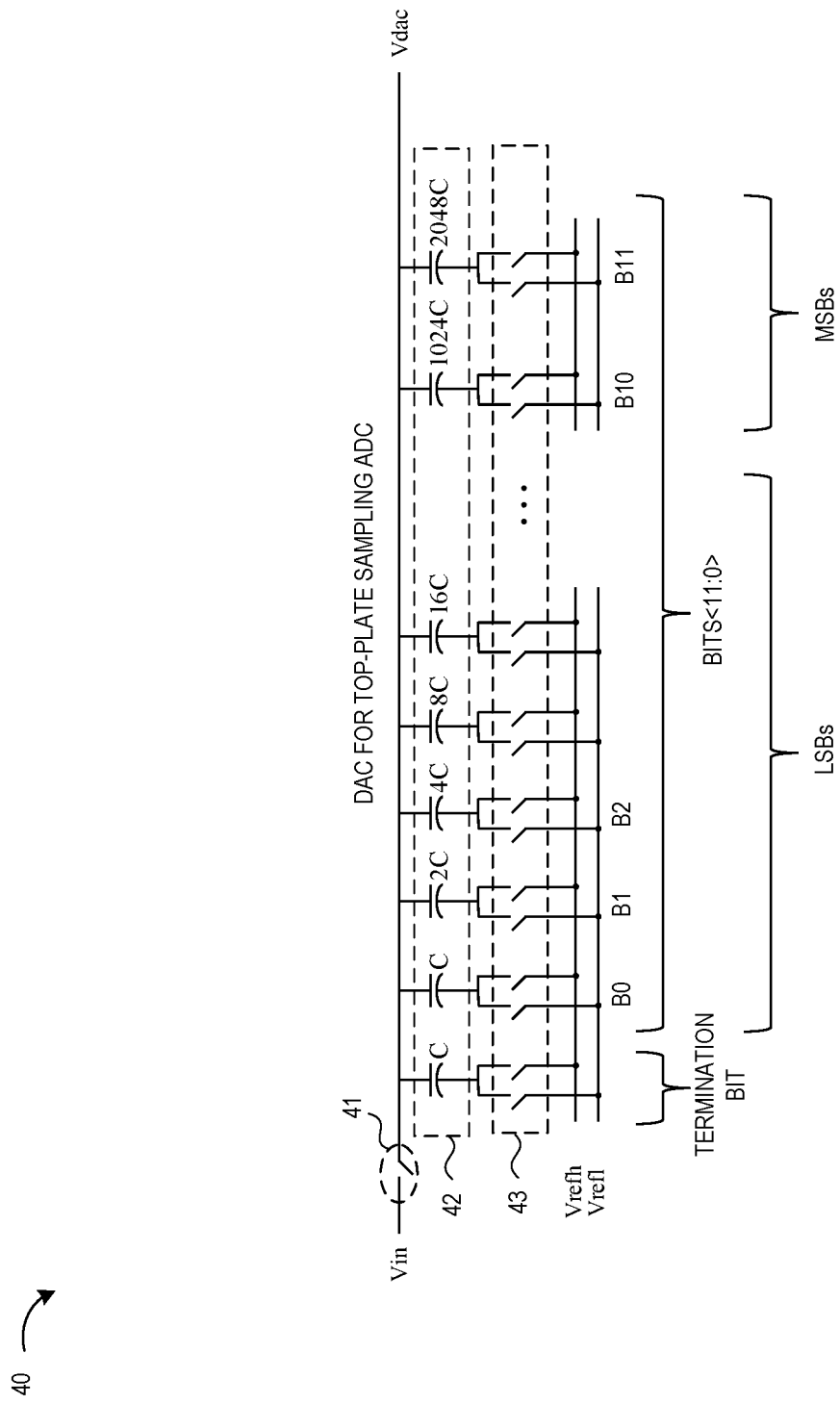
FIG. 4 depicts a simplified circuit schematic of a DAC for a top-plate sampling SAR ADC.

To provide a contextual understanding for the present disclosure, reference is now made to FIG. 4 depicts a simplified circuit schematic of a 12-bit DAC 40 for a top-plate sampling SAR ADC. The depicted DAC 40 includes an array of capacitors 42, including a first termination capacitor having a unit capacitance value of C, and 12 additional capacitors corresponding to bits b0-b11, each having a binary weighted capacitance, starting with a first capacitor having a capacitance C, a second capacitor having a capacitance 2 C, and continuing until the 12$^{th}$ capacitor having a capacitance 2048 C.

Each capacitor in the capacitor array 42 is selectively coupled between an input voltage Vin and either a low reference voltage Vrefh or high reference voltage Vrefh via respective switches. In particular, the input voltage Vin may be selectively applied to the top plate of the array of capacitors 42 via input switch 41 which may be activated by asserting an input control signal. In addition, each capacitor bottom plate (e.g., 4 C) may be coupled to Vrefh by asserting a corresponding control bit (e.g., b2) to turn on a corresponding Vrefh switch or may be coupled to Vrefl by deasserting the corresponding control bit (e.g., b2) to turn ON a corresponding Vrefl switch. The top plate of each capacitor in the array of capacitors 42 may be coupled to provide the Vdac signal directly to a comparator input terminal. A first portion of the array of capacitors 42 having the larger capacitance values (e.g., 1024 C, 2048 C) correspond to the most significant bits (MSBs) of the DAC 40, and a second portion of the array of capacitors 42 having the smaller capacitance values (e.g., C, 2 C . . . ) correspond to the least significant bits (LSBs) of the DAC 40.

One of the primary limiters of linearity in a SAR ADC design is the DAC element matching. There are many techniques to improve the matching, including calibration methods and dynamic element matching methods. However, these techniques are usually only performed on the MSBs because the required logic becomes prohibitively large for the full array of a high-resolution ADC. Another method to improve the linearity of the rest of the ADC (the LSB capacitor matching) is the mismatch error shaping (MES) method. In this method, the LSB result of the previous conversion is sampled for the current conversion by connecting the LSB capacitor bottom plates to Vrefh/Vrefl during sample phase, depending on their result from previous successive approximation (SAR) phase. With top plate sampling MES methods, there is an extra "phase" at the end of sampling where these LSBs are switched to Vrefl before beginning the SAR conversion phase. The result is then digitally adjusted to subtract the previous LSB result. Mathematically this creates a 1st-order shaping of the LSB capacitor mismatch. However, the major drawback of this method is that it reduces the input range of the ADC. While there are ways to recover this input range, they add complexity and cost to the SAR ADC design.

Figure 5:
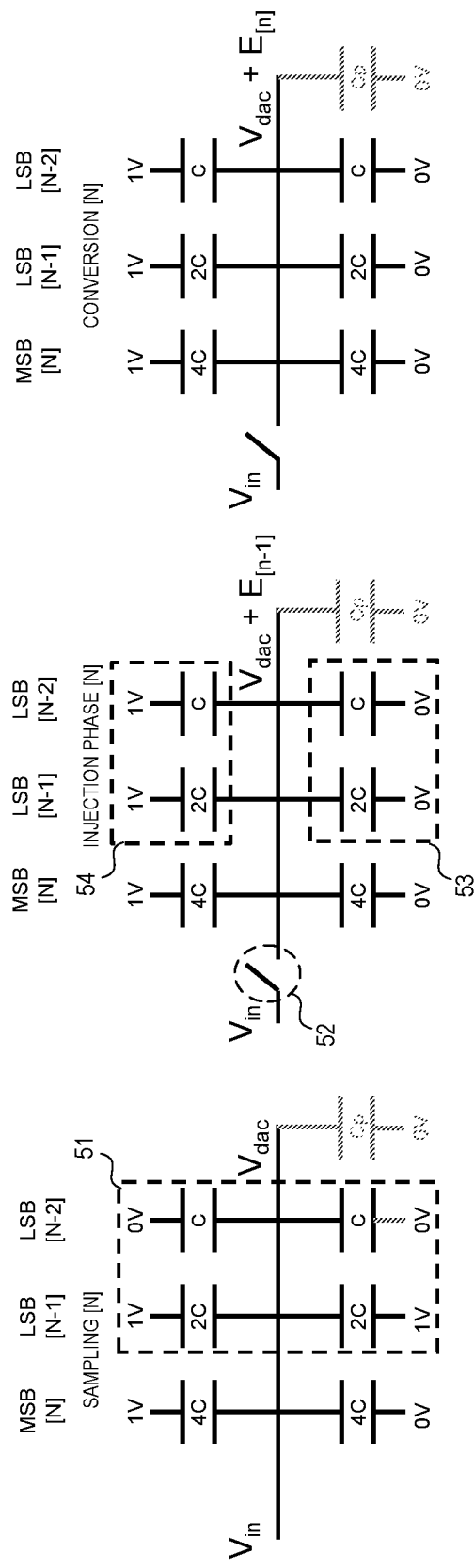
FIGS. 5A-C depict example sampling, injection and conversion phases of a mismatch error shaping sequence used with a top-plate sampling SAR ADC.

To provide a contextual understanding for the present disclosure, reference is now made to FIGS. 5A-C which depict example sampling, injection and conversion phases of a mismatch error shaping sequence used with a top-plate sampling SAR ADC. In particular, FIG. 5A depicts a sampling phase where the input voltage Vin is connected to the top sampling plate which is directly connected to the comparator input Vdac (e.g., Vin=Vdac). At this time, only the most significant bit (MSB) [N] is reset, and the less significant bits [N−1] [N−2] are respectively set to 1V and 0V as part of the mismatch error shaping of these bits (as indicated with the dashed box 51).

As depicted FIG. 5B, an injection phase begins after completion of the sampling phase when the input voltage sampling switch 52 opens which causes the Vdac node to float. During the injection phase, the DAC is pushed into a reset state by resetting the bottom capacitors for the less significant bits [N−1] [N−2] (indicated with the dashed box 53) to 0V and setting the top capacitors for the less significant bits [N−1] [N−2] (indicated with the dashed box 54) to 1V. This creates an extra voltage $E_{[n-1]}$ on the floating Vdac node which represents the analog error of the previous sample $E_{[n-1]}$. In other words, the comparator input voltage Vdac=−Vin+Vlsb[n−1].

As depicted FIG. 5C, a conversion phase begins which uses the comparator input voltage Vdac=Vdac−Vin+Vlsb[n−1] to perform the binary SAR algorithm for converting the analog voltage to a digital voltage. During the conversion phase, the ADC sample N includes the residue $E_{[n]}$ of a previous conversion which is digitally corrected, leaving the analog error due to mismatch from the previous sample left. This is basically a 1$^{st}$-order mismatch shaping where the voltage input signal Vin is oversampled and the =mismatch is pushed to higher frequencies and is filtered away, resulting in improved total harmonic distortion performance.

Figure 6:
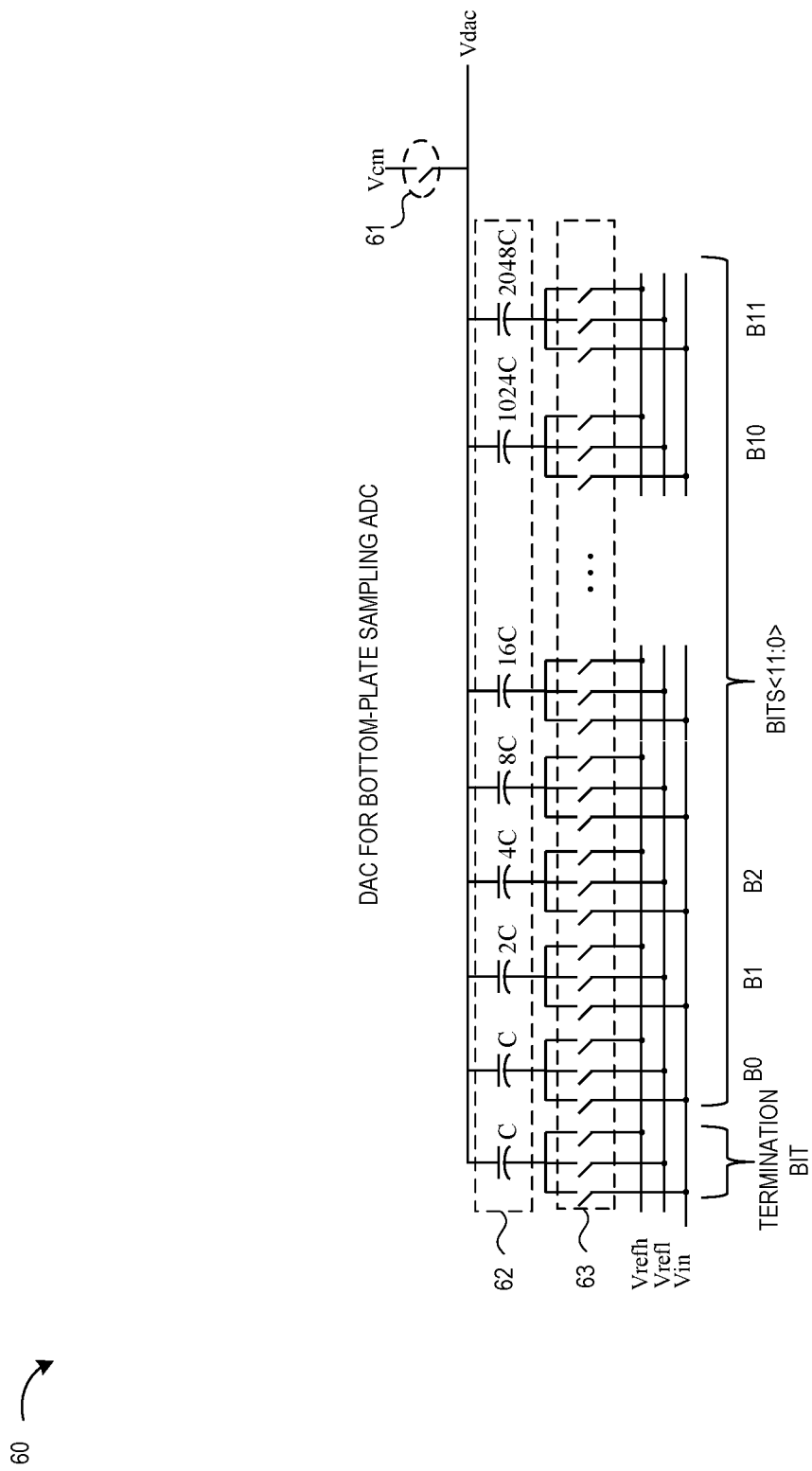
FIG. 6 depicts a simplified circuit schematic of a DAC for a bottom-plate sampling SAR ADC.

To provide a contextual understanding for the present disclosure, reference is now made to FIG. 6 which depicts a simplified circuit schematic of a 12-bit DAC 60 for a bottom-plate sampling SAR ADC. The depicted DAC 60 includes an array of capacitors 62, including a first termination capacitor having a unit capacitance value of C, and 12 additional capacitors corresponding to bits b0-b11, each having a binary weighted capacitance, starting with a first capacitor having a capacitance C, a second capacitor having a capacitance 2 C, and continuing until the 12$^{th}$ capacitor having a capacitance 2048 C. Each top plate of the array of capacitors 62 is connected over a switch 61 to be driven to a common mode voltage Vcm during the sample phase while the analog input signal Vin is applied to the capacitor bottom plates using the switching circuitry 63. In addition to receiving the analog input signal Vin, the switching circuitry 63 receives the high voltage reference Vrefh and the low voltage reference Vrefl, and each of these signals are coupled to a selected number of binary-weighted capacitors 62 in response to DAC Control signals. In particular, each of the switching circuits 63 connect to the binary-weighted capacitors 62 can be individually and selectively manipulated to select any of these three signals in response to DAC Control signals. As seen from the foregoing, the fact that the analog input signal Vin is sampled on the bottom plates of all the capacitors means that mismatch error shaping techniques cannot be used with bottom-plate sampling SAR ADCs since the Vrefh and Vrefl voltages cannot be sampled on the LSB capacitors since the bottom plates of the LSB capacitors are being used for sampling.

Figure 7:
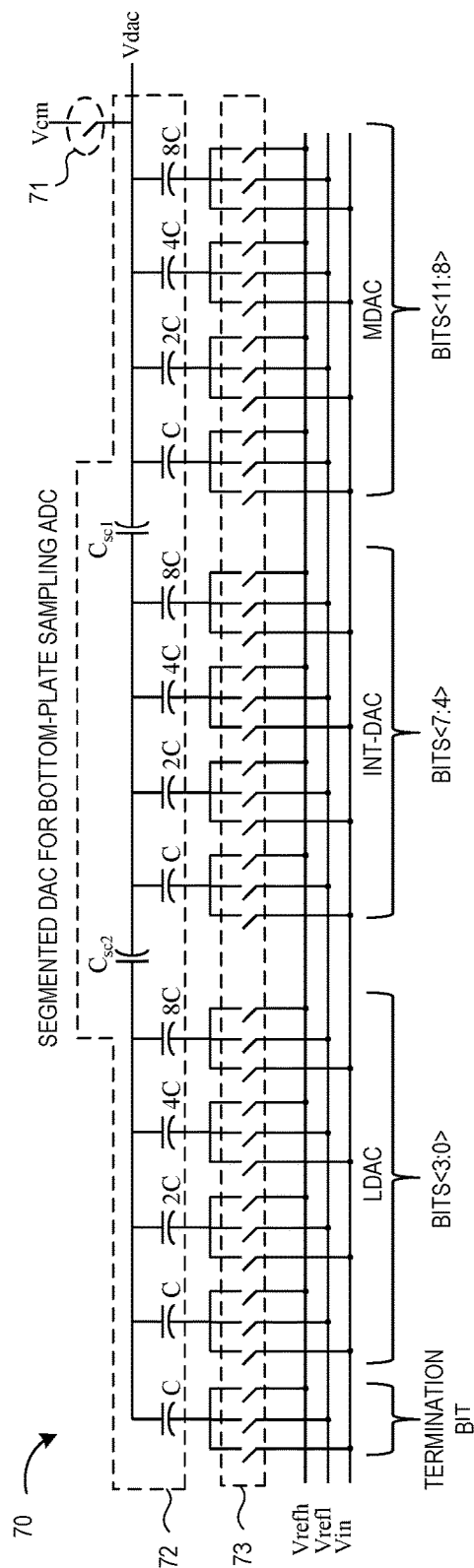
FIG. 7 depicts a simplified circuit schematic of a segmented DAC for a bottom-plate sampling SAR ADC.

To provide a contextual understanding for the present disclosure, reference is now made to FIG. 7 which shows a simplified circuit schematic of a segmented DAC 70 that may be connected to a comparator as part of a bottom-plate sampling SAR ADC. The depicted segmented DAC 70 includes an array of capacitors 72, including a first termination capacitor having a unit capacitance value of C, and 12 additional capacitors corresponding to bits b0-b11 that are segmented into different capacitor sub-arrays or segments. In addition, the depicted capacitor array 72 includes attenuating or scaling capacitors Csc1, CSc2 that are included to split the array into multiple array portions or segments, including an LDAC array (for the least significant bits, BITS<3:0>), INT-DAC array (for the intermediate significant bits, BITS<7:4>), and MDAC array (for the most significant bits, BITS<11:8>). In particular, the capacitors corresponding to the LDAC array correspond to bits 0-3, and each has a binary weighted capacitance, starting with the bit 0 capacitor having a unit capacitance of C, the bit 1 capacitor having a unit capacitance of 2 C, the bit 2 capacitor having a unit capacitance of 4 C, and the bit 3 capacitor having a unit capacitance of 8 C. Similarly, the capacitors corresponding to the INT-DAC array correspond to bits 7-4, and each has a binary weighted capacitance, starting with the bit 4 capacitor having a unit capacitance of C, the bit 5 capacitor having a unit capacitance of 2 C, the bit 6 capacitor having a unit capacitance of 4 C, and the bit 7 capacitor having a unit capacitance of 8 C. Finally, the capacitors corresponding to the MDAC array correspond to bits 11-8, and each has a binary weighted capacitance, starting with the bit 8 capacitor having a unit capacitance of C, the bit 9 capacitor having a unit capacitance of 2 C, the bit 10 capacitor having a unit capacitance of 4 C, and the bit 11 capacitor having a unit capacitance of 8 C. While the capacitors in the segmented DAC 70 are shown as binary weighted capacitors for simplicity, it will be appreciated that any suitable grouping and/or decoding method may be used.

Each capacitor in the array 72 is connected by a switching circuit 71 to charge the top plates of each MSB capacitor to a common mode voltage (Vcm). In addition, the bottom plates of the capacitors 72 are connected over a switching circuit 73 to a high reference voltage Vrefh, a low reference voltage Vrefl, or the analog input voltage Vin in response to DAC Control signals supplied to the switching circuit 73, where Vrefl≤Vin≤Vrefh. Though not shown, DAC control circuitry provides gating control signals to the switches 73 for connecting the bottom plates of the capacitor array 72 to the Vrefl, Vrefh, and Vin signals, as needed, based on the current operation (e.g., sample or comparison phases of a conversion). Operation of the DAC control circuitry with respect to normal sample and conversion operation is known in the art, and will not be discussed in full detail. In summary, the analog input voltage Vin is first sampled during a sample phase when each of MSB capacitor top plates is charged to the common mode voltage Vcm, and then the analog input voltage Vin is sampled by setting the bottom capacitor plates to Vin. Since Vrefh>Vrefl, setting the bottom capacitor plate to Vrefh may be referred to as turning ON a capacitor, and setting the bottom capacitor plate to Vrefl may be referred to as turning OFF a capacitor. Following the sample phase, a comparison or conversion phase is initiated in which each result bit value is determined, in turn, by the comparator and digital SAR logic block (not shown).

By using scaling capacitors Cs1, Csc2 to separate the array 72 into the array segments LDAC, INT-DAC, MDAC, the total capacitance, size, power consumption, and RC time constant for the capacitor array 72 is reduced as compared to a non-segmented capacitor array. In particular, the depicted example of the segmented 4-4-4 12b DAC capacitor array for the bottom-plate sampling ADC 70 requires only 48 capacitor elements, whereas a full 12b DAC capacitor array (such as shown in FIG. 6) requires 4096 capacitor elements. However, there are disadvantages that arise from segmenting the DAC capacitor array 72. For example, the scaling capacitors (Csc1, Csc2) can degrade element matching in the DAC 70 since the scaling capacitors are typically not unit sized. In addition, mismatch error shaping cannot be performed with this bottom-plate sampling configuration because all of the capacitor array elements 72 are used for sampling the analog input voltage Vin.

Figure 8:
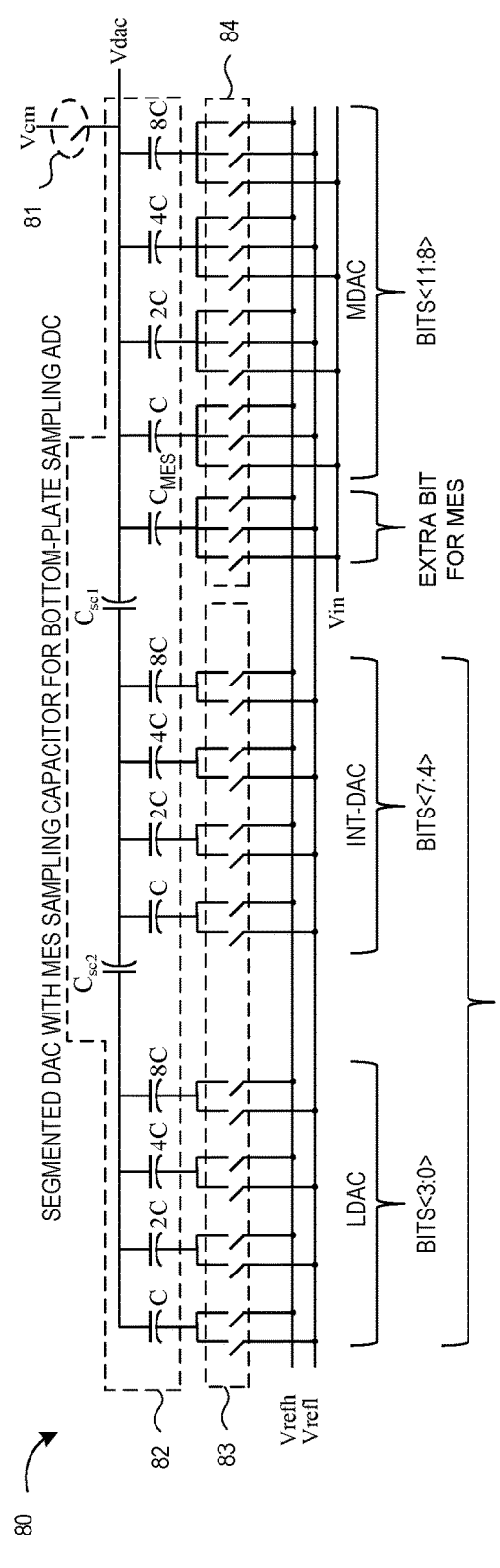
FIG. 8 depicts a simplified circuit schematic of a segmented DAC for a bottom-plate sampling SAR ADC which includes a designated MES sampling capacitor in accordance with selected embodiments of the present disclosure.

To provide a detailed understanding of selected embodiments of the present disclosure, reference is now made to FIG. 8 which shows a simplified circuit schematic of a DAC 80 for a bottom-plate sampling SAR ADC which includes a designated MES sampling capacitor CMES. The depicted DAC 80 includes an array of capacitors 82, including a plurality of additional capacitors corresponding to bits b0-b11, and an extra MES sampling capacitor CMES that is located at a designated position in the capacitor array 82 for use in providing mismatch error shaping (MES) from the less significant capacitors in the capacitor array 82 so that input voltage sampling occurs only on the more significant capacitors in the capacitor array 82. In selected embodiments, the DAC 80 includes attenuating or scaling capacitors Csc1, CSc2 that are included to split the capacitor array 82 into multiple array portions or segments, including an LDAC array (for the least significant bits, BITS<3:0>), INT-DAC array (for the intermediate significant bits, BITS<7:4>), and MDAC array (for the most significant bits, BITS<11:8>). In such embodiments, the capacitors in each array segment can have binary weighted capacitance values, starting with a first bit capacitor having a unit capacitance of C, a second bit capacitor having a unit capacitance of 2 C, a third bit capacitor having a unit capacitance of 4 C, and fourth bit capacitor having a unit capacitance of 8 C. However, in other embodiments, non-binary capacitor groupings may be used.

Each capacitor in the array 82 is connected by a switching circuit 81 to charge the top plates of each MSB capacitor to a common mode voltage (Vcm). In addition, the bottom plates of the capacitors 82 in the LDAC array and INT-DAC array are connected over a switching circuit 83 to a high reference voltage Vrefh or a low reference voltage Vrefl in response to DAC Control signals supplied to the switching circuit 83, where Vrefl<Vrefh. However, the bottom plates of the capacitors 82 in the MDAC array are connected over a switching circuit 84 to either the high reference voltage Vrefh, the low reference voltage Vrefl, or the analog input voltage Vin in response to DAC Control signals supplied to the switching circuit 84, where Vrefl<Vrefh. Though not shown, DAC control circuitry provides gating control signals to the switches 83, 84 for connecting the bottom plates of the capacitor array 82 to the Vrefl, Vrefh, or Vin signals, as needed, based on the current operation (e.g., sample or comparison phases of a conversion).

In the example depicted in FIG. 8, the most significant DAC array (MDAC) also includes a single capacitor CMES as an extra capacitor bit that is used to effectively sample the equivalent charge of all less significant capacitor bits (e.g., BITS<0:7>). In this configuration, the analog input voltage Vin is sampled on only the most significant capacitor bits (e.g., BITS<11:8>), thereby enabling the less significant capacitor bits (e.g., BITS<0:7>) to be used for mismatch error shaping. After each conversion, the resulting bit values 7:0 of the converted digital result value are applied during sample of the next ADC conversion (e.g., a bit value of "1" in the digital result value means that Vrefh is selected on the bottom plate during sampling, and a bit value of "0" in the digital result value means that Vrefl is selected on the bottom plate during sampling). Then, just before the SAR begins on the next conversion, the bottom plates of 7:0 are all switched to Vrefl. When the SAR is complete and a conversion result is achieved, the value of 7:0 applied during sample is subtracted digitally from the result. This will provide first order shaping of the mismatch of the less significant capacitor bits (e.g., BITS<0:7>) in similar fashion to the top-plate sampling version depicted in FIG. 5. In fact, it also mismatch error shapes the scaling capacitors Csc1, Csc2 which are difficult to match due to typically having non-unit sizing.

As described hereinabove, one of the known problems from using mismatch error shaping is the loss of input range. However, the inclusion of a single extra capacitor to the MDAC array can be used to recover or restore the lost input range caused by performing mismatch error shaping. This is achieved by using the extra bit during the successive approximation (SAR) phase as a redundant bit that is equivalent to BIT<8>. This increases the range just enough to recover even the largest possible LSB value (BITS<7:0>=$FF) being sampled during mismatch error shaping to allow accurate approximation of input voltages throughout the entire range (Vrefl to Vrefh) while doing mismatch error shaping. Another advantage of the extra capacitor is that gain error may be eliminated by using the extra capacitor to sample the input. Yet another and additional possible benefit from the extra capacitor is that the circuit which generates the analog input voltage Vin sees a more uniform parasitic capacitance since it only drives the MDAC array, and is not also driving the sampling capacitors in the LDAC array and INT-DAC array which have parasitic capacitance values that are out of proportion to the bit since the bottom plates are not scaled by the scaling capacitors Csc1, CSc2.

As illustrated in FIG. 8, the extra capacitor CMES is located in the LSB position of the MDAC array. This has the advantage of only using a single unit capacitance value C for the sample capacitor CMES. However, it will be appreciated that the extra capacitor CMES can be located in other positions in the MDAC array or in the capacitor array 82, though it will need to be sized to provide mismatch error shaping (MES) from the less significant capacitors in the capacitor array 82 and to provide dynamic element matching or other calibration on the extra capacitor and the more significant capacitors. For example, the extra capacitor CMES could be located in a more significant bit position (e.g., next to the 2 C capacitor in the MDAC array), provided that the size of the extra capacitor CMES is at least as big as the sum of the less significant capacitors.

In addition to including the extra capacitor CMES in the segmented DAC capacitor array 82, the extra capacitor CMES may be included with a non-segmented DAC capacitor array which does not include bridge capacitors (e.g., Csc1, Csc2). In such non-segmented DAC embodiments, capacitor array will include additional capacitor elements (e.g., 4096 capacitors instead of 48 capacitors), and the extra capacitor CMES will need to be positioned and appropriately sized with capacitance value that is the sum of all the less significant capacitors so that mismatch error shaping can be performed on the less significant bit capacitors. For example, a standard 12b non-segmented DAC may include the extra capacitor CMES next to bit position BIT=9, in which case the capacitance value for the extra capacitor CMES=512 C.

Figure 9:
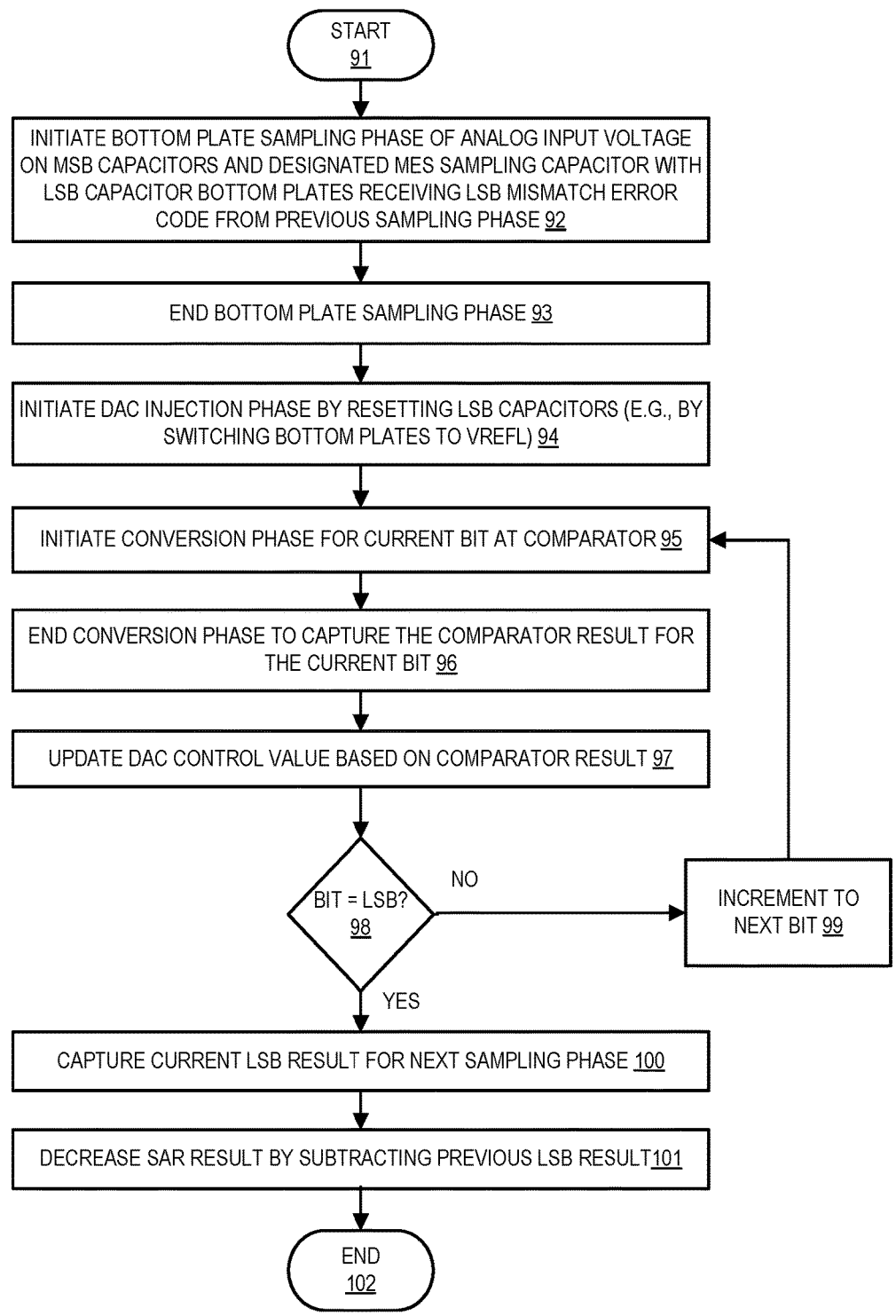
FIG. 9 illustrates a simplified flow chart showing the logic for operating a bottom-plate sampling SAR ADC which includes a designated MES sampling capacitor in accordance with selected embodiments of the present disclosure.

To provide additional details for an improved understanding of selected first embodiments of the present disclosure, reference is now made to FIG. 9 which depicts a simplified flow chart 90 showing the logic for operating a bottom-plate sampling SAR ADC which includes a designated MES sampling capacitor for performing mismatch error shaping of selected least significant bits. In an example embodiment, the processing shown in FIG. 9 may be performed at an SAR ADC with an SAR engine embodied with dedicated hardware, software, or hybrid implementations and configured for controlling the SAR DAC and comparator with feedback control signals which feedback mismatch error to LSB capacitors from a previous conversion cycle so that an extra capacitor in an MSB section can be used to perform mismatch error shaping during a current sampling phase.

At step 91, the methodology starts with the control logic and/or hardware at the SAR engine which is configured to initiate a bottom plate sampling phase of an analog input voltage on the MSB capacitors and a designed MES sampling capacitor while the LSB capacitor bottom plates receive LSB mismatch error codes from a previous sampling phase (step 92). With reference to the example shown in FIGS. 3 and 8, the SAR control logic 35 may be used to generate sampling DAC control feedback signals which initiate the sampling phase at the DAC 31 by connecting the analog input voltage Vin to the bottom capacitor plates while the common mode voltage Vcm is connected to the top capacitor plates.

At step 93, the bottom plate sampling phase is ended. With reference to the example shown in FIGS. 3 and 8, the control logic and/or hardware at the SAR engine 35 may be configured to end the bottom plate sampling phase at the DAC 31 by resetting the sampling DAC control feedback signals to disconnect the analog input voltage Vin from the bottom capacitor plates and disconnecting the common mode voltage Vcm from the top capacitor plates.

At step 94, a DAC injection phase is initiated by resetting the LSB capacitors in the DAC array. With reference to the example shown in FIGS. 3 and 8, the control logic and/or hardware at the SAR engine 35 may be configured to initiate the DAC injection phase by switching the bottom capacitor plates of the DAC array to a lower reference voltage Vrefl, effectively resetting the LSB capacitors.

At step 95, the conversion phase is initiated for the current bit at the comparator, starting with the most significant bit. With reference to the example shown in FIGS. 3 and 8, the control logic and/or hardware at the SAR engine 35 may be configured to initiate the conversion phase by generating clock signal for feedback to the comparator to initiate the conversion phase for the current bit.

At step 96, the conversion phase is ended for the current bit at the comparator. With reference to the example shown in FIGS. 3 and 8, the control logic and/or hardware at the SAR engine 35 may be configured to end the conversion phase by generating a latch signal for feedback to the comparator to capture the comparator result for the current bit.

At step 97, the SAR engine updates the DAC control value based on the comparator results. With reference to the example shown in FIGS. 3 and 8, the control logic and/or hardware at the SAR engine 35 may be configured to update the DAC control value by storing the comparison result in the SAR register 36.

At step 98, it is determined if the DAC control value for the least significant bit (LSB) has been captured. If not (negative outcome to decision 98), the next most significant bit is selected or incremented (step 99), and the steps 95-98 are iteratively repeated until the DAC control codes for the least significant bit are updated (affirmative outcome to decision 98), at which point the current LSB result is captured to be used as mismatch error code for the next sampling phase (step 100) and the SAR result from the current sampling phase is decreased by subtracting the previously captured LSB result (step 101). With reference to the example shown in FIGS. 3 and 8, the control logic and/or hardware at the SAR engine 35 may be configured to digitally subtract the previous conversion LSB value (previous mismatch error code) from the complete SAR result stored in the SAR register 36.

At step 102, the processing ends.

As disclosed herein, the disclosed method, system, and apparatus for performing bottom plate sampling SAR ADC conversion may be implemented with a successive approximation register engine embodied with dedicated hardware, software, or hybrid implementations that is connected and controlled by control logic and/or computer program product having program code portions for performing steps of a method and/or for performing functions of a device or system in which a designated extra capacitor in the multi-bit capacitor array is used to provide mismatch error shaping (MES) from less significant capacitors in the multi-bit capacitor array so that input voltage sampling occurs only on the more significant capacitors in the multi-bit capacitor array. Although embodiments are described in the context of using an example SAR engine to control a multi-bit bottom sampling capacitor array which uses a designated MES sampling capacitor to perform mismatch error shaping on less significant capacitor bits, the proposed bottom plate sampling SAR ADC computation method, system, and apparatus may used any desired configuration of control logic, latches, and registers to perform mismatch error shaping on a designated MES sampling capacitor. For example, although FIG. 8 and the discussion thereof describe an exemplary SAR ADC architecture which includes a segmented DAC array, this exemplary architecture is presented merely to provide a useful reference in discussing various aspects of the invention. Of course, the description of the architecture has been simplified for purposes of discussion, and it is just one of many different types of appropriate architectures that may be used in accordance with the invention.

Those skilled in the art will recognize that the boundaries between logic blocks and circuit elements are merely illustrative and that alternative embodiments may merge logic blocks or circuit elements or impose an alternate decomposition of functionality upon various logic blocks or circuit elements. Thus, it is to be understood that the architecture depicted herein is merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality. Furthermore, those skilled in the art will recognize that boundaries between the functionality of the above-described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

By now it should be appreciated that there has been provided an apparatus, method, program code, and system for controlling a successive approximation register (SAR) analog-to-digital converter (ADC) that includes a digital-to-analog converter (DAC), a comparator, and successive-approximation-register (SAR) circuitry. The disclosed DAC is connected and configured to generate an output voltage from DAC feedback control signals, and includes a plurality of Most Significant Bit (MSB) capacitors having bottom and top capacitor plates. In selected embodiments, the plurality of MSB capacitors are encoded with one or more binary capacitors having bottom and top capacitor plates. The disclosed DAC also includes a plurality of Least Significant Bit (LSB) capacitors having bottom and top capacitor plates. In selected embodiments, the plurality of LSB capacitors are encoded with one or more binary capacitors having bottom and top capacitor plates. The DAC also includes a mismatch error shaping capacitor having bottom and top capacitor plates, with the mismatch error shaping capacitor connected in a bit position between the plurality of LSB capacitors and the plurality of MSB capacitors. The DAC also includes a first set of switches to couple the bottom capacitor plates of the plurality of MSB capacitors and the mismatch error shaping capacitor to receive an analog input voltage, a high reference voltage, or a low reference voltage in response to first DAC feedback control signals, wherein the high reference voltage is greater than the low reference voltage. In selected embodiments, each switch in the first set of switches is a tri-state switch for selectively connecting a bottom capacitor plate of the plurality of MSB capacitors or the mismatch error shaping capacitor to the analog input voltage, high reference voltage, or low reference voltage in response to the first DAC feedback control signals. The DAC also includes a second set of switches to couple the bottom capacitor plates of the plurality of LSB capacitors to receive the high reference voltage or the low reference voltage in response to second DAC feedback control signals. In selected embodiments, each switch in the second set of switches is a bi-state switch for selectively connecting a bottom capacitor plate of the plurality of LSB capacitors to the high reference voltage or low reference voltage in response to the second DAC feedback control signals. In other selected embodiments, the second set of switches, in response to the second DAC feedback control signals, couple the bottom capacitor plates of the plurality of LSB capacitors to receive the high reference voltage or the low reference voltage corresponding to the mismatch error value from the previous SAR conversion cycle. The disclosed comparator has a first input coupled to receive the output voltage from the DAC, a second input, and a comparison output based on a difference in voltage between the first input and the second input. The disclosed SAR circuitry has an input coupled to receive the comparison output, and an output to provide a digital value corresponding to a digital representation of the analog input voltage, where the SAR circuitry is configured to feedback, through the second DAC feedback control signals provided to the second set of switches, a mismatch error value from a previous SAR conversion cycle to the plurality of LSB capacitor during a current sampling cycle. In selected embodiments, the SAR circuitry is configured to perform mismatch error shaping of the least significant bits in the DAC by using the mismatch error shaping capacitor to sample an equivalent charge of the plurality of LSB capacitors in the DAC. In other selected embodiments, the SAR circuitry is configured to control the second set of switches to couple the bottom capacitor plates of the plurality of LSB capacitors to the low reference voltage between each sampling cycle and each subsequent conversion cycle. In other selected embodiments, the SAR circuitry is configured, at each conversion cycle, to subtract a mismatch error value from a predetermined number of least significant bits corresponding to the plurality of LSB capacitors from the digital value to generate the final digital representation of the analog input voltage, where the mismatch error value was determined during a previous conversion cycle. In selected embodiments, the mismatch error shaping capacitor has a capacitance that is equal in size to a sum of a capacitance of the plurality of LSB capacitors. In selected embodiments, the DAC is a segmented DAC which as a scaling capacitor having first and second scaling capacitor plates, with the first scaling capacitor plate connected to the top capacitor plates of the plurality of MSB capacitors and with the second scaling capacitor plate connected to the top capacitor plates of the plurality of LSB capacitors, and where the top capacitor plate of the mismatch error shaping capacitor is connected to the first scaling capacitor plate and the top capacitor plates of the plurality of MSB capacitors. In such embodiments, the capacitance of the mismatch error shaping capacitor is approximately equal to a sum of a capacitance of the plurality of LSB capacitors as seen through the scaling capacitor.

In another form, there is provided an SAR ADC method, apparatus, program code, and system. The disclosed method includes providing an analog input voltage and mismatch error shaping code voltage values to a split-capacitor digital-to-analog converter (DAC) which includes a Most Significant Bits (MSBs) sub-DAC with one or more MSBs encoded with one or more first capacitors, a Least Significant Bits (LSBs) sub-DAC with one or more LSBs encoded with one or more second capacitors, a mismatch error shaping capacitor coupled to the MSBs sub-DAC, and a scaling capacitor coupled between the LSBs and MSBs sub-DACs. In addition, the disclosed method includes initiating bottom plate sampling of the analog input voltage on the first capacitors of the MSBs sub-DAC and the mismatch error shaping capacitor with the one or more second capacitors of the LSB sub-DAC receiving mismatch error shaping code voltage values. In selected embodiments, the mismatch error shaping code voltage values correspond to LSB results captured from the digital value during a previous SAR ADC conversion cycle. In selected embodiments, bottom plate sampling is initiated by connecting a common mode voltage to top capacitor plates of the first capacitors of the MSBs sub-DAC and the mismatch error shaping capacitor. The disclosed method also includes ending bottom plate sampling of the analog input voltage. In addition, the disclosed method includes initiating an injection phase by resetting the one or more second capacitors of the LSB sub-DAC. In selected embodiments, the injection phase is initiated by connecting a low reference voltage to bottom capacitor plates of the split-capacitor DAC that resets the one or more second capacitors of the LSB sub-DAC. The disclosed method also includes performing a comparison using an output of the split-capacitor DAC to provide a comparison output of a current SAR ADC conversion cycle. In addition, the disclosed method includes performing a successive-approximation on the comparison output to provide a digital value which represents an input voltage to the split-capacitor DAC. The disclosed method also includes capturing a current LSB result from the digital value for use in a subsequent SAR ADC conversion cycle. In addition, the disclosed method includes performing mismatch error shaping on the digital value by subtracting, from the digital value, a LSB result captured from a previous SAR ADC conversion cycle. In selected embodiments, the first capacitors of the MSBs sub-DAC and the second capacitors of the LSBs sub-DAC are each, respectively, encoded with one or more binary capacitors. In other selected embodiments, the split-capacitor DAC also includes a termination capacitor coupled to the LSBs sub-DAC.

In yet another form, there is provided a SAR ADC apparatus, method, program code, and system that includes a first and second DACs, a differential comparator, and SAR circuitry. The first DAC is configured to receive a first input voltage signal, a high voltage reference, and a low voltage reference, and to generate therefrom a first DAC output. In addition, the first DAC includes a first MSBs sub-DAC with one or more MSBs encoded with one or more first capacitors, a first LSBs sub-DAC with one or more LSBs encoded with one or more second capacitors, and a first mismatch error shaping capacitor coupled to the first MSBs sub-DAC. The second DAC is configured to receive a second input voltage signal, the high voltage reference, and the low voltage reference, and to generate therefrom a second DAC output. In addition, the second DAC includes a second MSBs sub-DAC with one or more MSBs encoded with one or more first capacitors, a second LSBs sub-DAC with one or more LSBs encoded with one or more second capacitors, and a second mismatch error shaping capacitor coupled to the second MSBs sub-DAC. The a differential comparator has a first input coupled to receive the first DAC output from the first DAC, a second input coupled to receive the second DAC output from the second DAC, and a comparator output. In addition, the differential comparator is configured to generate a differential comparison of the first and second DAC outputs at the comparator output. The SAR circuitry has an input coupled to receive the comparator output. In addition, the SAR circuitry is configured to provide a digital value corresponding to a digital representation of a difference between the first and second analog input voltages. In addition, the SAR circuitry is configured to feedback, to the first and second DACs, control signals. In response to the control signals, the first DAC initiates first DAC bottom plate sampling of the first analog input voltage on the first capacitors of the first MSBs sub-DAC and the first mismatch error shaping capacitor while the one or more second capacitors of the first LSB sub-DAC receive first mismatch error shaping code voltage values. In addition, the control signals cause the second DAC to initiate second DAC bottom plate sampling of the second analog input voltage on the first capacitors of the second MSBs sub-DAC and the second mismatch error shaping capacitor while the one or more second capacitors of the second LSB sub-DAC receive second mismatch error shaping code voltage values. Subsequently, the control signals end first and second DAC bottom plate sampling of the first and second analog input voltages at the first and second DACs. Subsequently, the control signals cause the first and second DACs to initiate an injection phase in the first and second DACs by resetting the one or more second capacitors of the first and second LSB sub-DACs. Subsequently, the differential comparator performs a differential comparison of the first and second DAC outputs to provide the differential comparison at the comparator output comparison output of a current SAR ADC conversion cycle. Subsequently, the SAR circuitry performs a successive-approximation on the differential comparison to provide the digital value. Once the SAR conversion is complete, the current LSB result is captured from the digital value for use in a subsequent SAR ADC conversion cycle. In addition, mismatch error shaping is performed on the digital value by subtracting, from the digital value, a LSB result captured from a previous SAR ADC conversion cycle. In selected embodiments, the first capacitors of the first and second MSBs sub-DACs and the second capacitors of the first and second LSBs sub-DACs are each, respectively, encoded with one or more binary capacitors. In other selected embodiments, the first DAC may include a first termination capacitor coupled to the first LSBs sub-DAC, and the second DAC may include a second termination capacitor coupled to the second LSBs sub-DAC.

Various illustrative embodiments of the present invention have been described in detail with reference to the accompanying figures. While various details are set forth in the foregoing description, it will be appreciated that the present invention may be practiced without these specific details, and that numerous implementation-specific decisions may be made to the invention described herein to achieve the circuit designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are shown in block diagram form, rather than in detail, in order to avoid limiting or obscuring the present invention. In addition, some portions of the detailed descriptions provided herein are presented in terms of algorithms or operations on data within a computer memory. Such descriptions and representations are used by those skilled in the art to describe and convey the substance of their work to others skilled in the art. Although the described exemplary embodiments disclosed herein are directed to an exemplary SAR engine, the present invention is not necessarily limited to the example embodiments illustrate herein, and various embodiments of the circuitry and methods disclosed herein may be implemented with other devices and software components. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A successive approximation register (SAR) analog-to-digital converter (ADC) comprising:
a digital-to-analog converter (DAC) connected and configured to generate an output voltage from DAC feedback control signals, the DAC comprising:
a plurality of Most Significant Bit (MSB) capacitors having bottom and top capacitor plates,
a plurality of Least Significant Bit (LSB) capacitors having bottom and top capacitor plates,
a mismatch error shaping capacitor having bottom and top capacitor plates, with the mismatch error shaping capacitor connected in a bit position between the plurality of LSB capacitors and the plurality of MSB capacitors,
a first set of switches to couple the bottom capacitor plates of the plurality of MSB capacitors and the mismatch error shaping capacitor to receive an analog input voltage, a high reference voltage, or a low reference voltage in response to first DAC feedback control signals, wherein the high reference voltage is greater than the low reference voltage, and
a second set of switches to couple the bottom capacitor plates of the plurality of LSB capacitors to receive the high reference voltage or the low reference voltage in response to second DAC feedback control signals;
a comparator having a first input coupled to receive the output voltage from the DAC, a second input, and a comparison output based on a difference in voltage between the first input and the second input; and
successive-approximation-register (SAR) circuitry having an input coupled to receive the comparison output, and an output to provide a digital value corresponding to a digital representation of the analog input voltage, where the SAR circuitry is configured to feedback, through the second DAC feedback control signals provided to the second set of switches, a mismatch error value from a previous SAR conversion cycle to the plurality of LSB capacitors during a current sampling cycle,
where the DAC comprises a segmented DAC comprising a scaling capacitor having first and second scaling capacitor plates, with the first scaling capacitor plate connected to the top capacitor plates of the plurality of MSB capacitors and with the second scaling capacitor plate connected to the top capacitor plates of the plurality of LSB capacitors, and where the top capacitor plate of the mismatch error shaping capacitor is connected to the first scaling capacitor plate and the top capacitor plates of the plurality of MSB capacitors.

2. The SAR ADC of claim 1, where a capacitance of the mismatch error shaping capacitor is approximately equal to a sum of a capacitance all of the plurality of LSB capacitors as seen through the scaling capacitor.

3. The SAR ADC of claim 1, where the second set of switches, in response to the second DAC feedback control signals, couple the bottom capacitor plates of the LSB capacitors to receive high reference voltage or the low reference voltage corresponding to the mismatch error value from the previous SAR conversion cycle.

4. The SAR ADC of claim 1, where the SAR circuitry is configured to control the second set of switches to couple the bottom capacitor plates of the plurality of LSB capacitors to the low reference voltage between each sampling cycle and each subsequent conversion cycle.

5. The SAR ADC of claim 1, where each switch in the second set of switches comprises a bi-state switch for selectively connecting a bottom capacitor plate of the LSB capacitors to the high reference voltage or low reference voltage in response to the second DAC feedback control signals.

6. The SAR ADC of claim 1, where the plurality of MSB capacitors are encoded with one or more binary capacitors having bottom and top capacitor plates.

7. The SAR ADC of claim 1, where the plurality of LSB capacitors are encoded with one or more binary capacitors having bottom and top capacitor plates.

8. The SAR ADC of claim 1, where the DAC further comprises a termination capacitor having bottom and top capacitor plates, with the top capacitor plate of the termination capacitor connected to the second scaling capacitor plate and the top capacitor plates of the LSB capacitors, and with the bottom capacitor plate of the termination capacitor connected to the second set of switches.

9. A successive approximation register (SAR) analog-to-digital converter (ADC) comprising:
a digital-to-analog converter (DAC) connected and configured to generate an output voltage from DAC feedback control signals, the DAC comprising:
a plurality of Most Significant Bit (MSB) capacitors having bottom and top capacitor plates,
a plurality of Least Significant Bit (LSB) capacitors having bottom and top capacitor plates,
a mismatch error shaping capacitor having bottom and top capacitor plates, with the mismatch error shaping capacitor connected in a bit position between the plurality of LSB capacitors and the plurality of MSB capacitors,
a first set of switches to couple the bottom capacitor plates of the plurality of MSB capacitors and the mismatch error shaping capacitor to receive an analog input voltage, a high reference voltage, or a low reference voltage in response to first DAC feedback control signals, wherein the high reference voltage is greater than the low reference voltage, and
a second set of switches to couple the bottom capacitor plates of the plurality of LSB capacitors to receive the high reference voltage or the low reference voltage in response to second DAC feedback control signals;
a comparator having a first input coupled to receive the output voltage from the DAC, a second input, and a comparison output based on a difference in voltage between the first input and the second input; and
successive-approximation-register (SAR) circuitry having an input coupled to receive the comparison output, and an output to provide a digital value corresponding to a digital representation of the analog input voltage, where the SAR circuitry is configured to feedback, through the second DAC feedback control signals provided to the second set of switches, a mismatch error value from a previous SAR conversion cycle to the plurality of LSB capacitors during a current sampling cycle,
where the SAR circuitry is configured to perform mismatch error shaping of the least significant bits in the DAC by using the mismatch error shaping capacitor to sample an equivalent charge of the plurality of LSB capacitors in the DAC.

10. A successive approximation register (SAR) analog-to-digital converter (ADC) comprising:
a digital-to-analog converter (DAC) connected and configured to generate an output voltage from DAC feedback control signals, the DAC comprising:
a plurality of Most Significant Bit (MSB) capacitors having bottom and top capacitor plates,
a plurality of Least Significant Bit (LSB) capacitors having bottom and top capacitor plates,
a mismatch error shaping capacitor having bottom and top capacitor plates, with the mismatch error shaping capacitor connected in a bit position between the plurality of LSB capacitors and the plurality of MSB capacitors,
a first set of switches to couple the bottom capacitor plates of the plurality of MSB capacitors and the mismatch error shaping capacitor to receive an analog input voltage, a high reference voltage, or a low reference voltage in response to first DAC feedback control signals, wherein the high reference voltage is greater than the low reference voltage, and
a second set of switches to couple the bottom capacitor plates of the plurality of LSB capacitors to receive the high reference voltage or the low reference voltage in response to second DAC feedback control signals;
a comparator having a first input coupled to receive the output voltage from the DAC, a second input, and a comparison output based on a difference in voltage between the first input and the second input; and
successive-approximation-register (SAR) circuitry having an input coupled to receive the comparison output, and an output to provide a digital value corresponding to a digital representation of the analog input voltage, where the SAR circuitry is configured to feedback, through the second DAC feedback control signals provided to the second set of switches, a mismatch error value from a previous SAR conversion cycle to the plurality of LSB capacitors during a current sampling cycle,
where the SAR circuitry is configured, at each conversion cycle, to subtract a mismatch error value from a predetermined number of least significant bits corresponding to the plurality of LSB capacitors from the digital value to generate the final digital representation of the analog input voltage, where the mismatch error value was determined during a previous conversion cycle.

11. A successive approximation register (SAR) analog-to-digital converter (ADC) comprising:
a digital-to-analog converter (DAC) connected and configured to generate an output voltage from DAC feedback control signals, the DAC comprising:
a plurality of Most Significant Bit (MSB) capacitors having bottom and top capacitor plates,
a plurality of Least Significant Bit (LSB) capacitors having bottom and top capacitor plates,
a mismatch error shaping capacitor having bottom and top capacitor plates, with the mismatch error shaping capacitor connected in a bit position between the plurality of LSB capacitors and the plurality of MSB capacitors,
a first set of switches to couple the bottom capacitor plates of the plurality of MSB capacitors and the mismatch error shaping capacitor to receive an analog input voltage, a high reference voltage, or a low reference voltage in response to first DAC feedback control signals, wherein the high reference voltage is greater than the low reference voltage, and
a second set of switches to couple the bottom capacitor plates of the plurality of LSB capacitors to receive the high reference voltage or the low reference voltage in response to second DAC feedback control signals;
a comparator having a first input coupled to receive the output voltage from the DAC, a second input, and a comparison output based on a difference in voltage between the first input and the second input; and
successive-approximation-register (SAR) circuitry having an input coupled to receive the comparison output, and an output to provide a digital value corresponding to a digital representation of the analog input voltage, where the SAR circuitry is configured to feedback, through the second DAC feedback control signals provided to the second set of switches, a mismatch error value from a previous SAR conversion cycle to the plurality of LSB capacitors during a current sampling cycle,
where each switch in the first set of switches comprises a tri-state switch for selectively connecting a bottom capacitor plate of the MSB capacitors or the mismatch error shaping capacitor to the analog input voltage, high reference voltage, or low reference voltage in response to the first DAC feedback control signals.

12. The SAR ADC of claim 11, where the mismatch error shaping capacitor has a capacitance that is equal in size to a sum of a capacitance all the plurality of LSB capacitors.

13. The SAR ADC of claim 11, where each switch in the second set of switches comprises a bi-state switch for selectively connecting a bottom capacitor plate of the LSB capacitors to the high reference voltage or low reference voltage in response to the second DAC feedback control signals.

14. The SAR ADC of claim 11, where the SAR circuitry is configured to control the second set of switches to couple the bottom capacitor plates of the plurality of LSB capacitors to the low reference voltage between each sampling cycle and each subsequent conversion cycle.

15. In a successive approximation register (SAR) analog-to-digital converter (ADC), a method comprising:
providing an analog input voltage and mismatch error shaping code voltage values to a split-capacitor digital-to-analog converter (DAC) comprising a Most Significant Bits (MSBs) sub-DAC with one or more MSBs encoded with one or more first capacitors, a Least Significant Bits (LSBs) sub-DAC with one or more LSBs encoded with one or more second capacitors, a mismatch error shaping capacitor coupled to the MSBs sub-DAC, and a scaling capacitor coupled between the LSBs and MSBs sub-DACs;
initiating bottom plate sampling of the analog input voltage on the first capacitors of the MSBs sub-DAC and the mismatch error shaping capacitor with the one or more second capacitors of the LSB sub-DAC receiving mismatch error shaping code voltage values;
ending bottom plate sampling of the analog input voltage;
initiating an injection phase by resetting the one or more second capacitors of the LSB sub-DAC;
performing a comparison using an output of the split-capacitor DAC to provide a comparison output of a current SAR ADC conversion cycle;
performing a successive-approximation on the comparison output to provide a digital value which represents an input voltage to the split-capacitor DAC;
capturing a current LSB result from the digital value for use in a subsequent SAR ADC conversion cycle; and
performing mismatch error shaping on the digital value by subtracting, from the digital value, a LSB result captured from a previous SAR ADC conversion cycle,
where the mismatch error shaping code voltage values correspond to LSB results captured from the digital value during a previous SAR ADC conversion cycle.

16. The method of claim 15, where initiating the injection phase comprises connecting a low reference voltage to bottom capacitor plates of the split-capacitor DAC that resets the one or more second capacitors of the LSB sub-DAC.

17. The method of claim 15, where the one or more first capacitors of the MSBs sub-DAC and the one or more second capacitors of the LSBs sub-DAC are each, respectively, encoded with one or more binary capacitors.

18. The method of claim 15, where the split-capacitor DAC further comprises a termination capacitor coupled to the LSBs sub-DAC.

19. In a successive approximation register (SAR) analog-to-digital converter (ADC), a method comprising:
providing an analog input voltage and mismatch error shaping code voltage values to a split-capacitor digital-to-analog converter (DAC) comprising a Most Significant Bits (MSBs) sub-DAC with one or more MSBs encoded with one or more first capacitors, a Least Significant Bits (LSBs) sub-DAC with one or more LSBs encoded with one or more second capacitors, a mismatch error shaping capacitor coupled to the MSBs sub-DAC, and a scaling capacitor coupled between the LSBs and MSBs sub-DACs;
initiating bottom plate sampling of the analog input voltage on the first capacitors of the MSBs sub-DAC and the mismatch error shaping capacitor with the one or more second capacitors of the LSB sub-DAC receiving mismatch error shaping code voltage values;
ending bottom plate sampling of the analog input voltage;
initiating an injection phase by resetting the one or more second capacitors of the LSB sub-DAC;
performing a comparison using an output of the split-capacitor DAC to provide a comparison output of a current SAR ADC conversion cycle;
performing a successive-approximation on the comparison output to provide a digital value which represents an input voltage to the split-capacitor DAC;
capturing a current LSB result from the digital value for use in a subsequent SAR ADC conversion cycle; and
performing mismatch error shaping on the digital value by subtracting, from the digital value, a LSB result captured from a previous SAR ADC conversion cycle,
where initiating bottom plate sampling comprises connecting a common mode voltage to top capacitor plates of the first capacitors of the MSBs sub-DAC and the mismatch error shaping capacitor.

20. A successive approximation register analog-to-digital converter ("SAR ADC") comprising:
a first digital-to-analog converter ("DAC") configured to receive a first input voltage signal, a high voltage reference, and a low voltage reference, and to generate therefrom a first DAC output, wherein the first DAC comprises a first Most Significant Bits (MSBs) sub-DAC with one or more MSBs encoded with one or more first capacitors, a first Least Significant Bits (LSBs) sub-DAC with one or more LSBs encoded with one or more second capacitors, and a first mismatch error shaping capacitor coupled to the first MSBs sub-DAC;

a second DAC configured to receive a second input voltage signal, the high voltage reference, and the low voltage reference, and to generate therefrom a second DAC output, wherein the second DAC comprises a second Most Significant Bits (MSBs) sub-DAC with one or more MSBs encoded with one or more first capacitors, a second Least Significant Bits (LSBs) sub-DAC with one or more LSBs encoded with one or more second capacitors, and a second mismatch error shaping capacitor coupled to the second MSBs sub-DAC;

a differential comparator having a first input coupled to receive the first DAC output from the first DAC, a second input coupled to receive the second DAC output from the second DAC, and a comparator output, the differential comparator configured to generate a differential comparison of the first and second DAC outputs at the comparator output; and successive-approximation-register (SAR) circuitry having an input coupled to receive the comparator output, wherein the SAR circuitry is configured to provide a digital value corresponding to a digital representation of a difference between the first and second analog input voltages, where the SAR circuitry is also configured to feedback, to the first and second DACs, control signals to:

initiate first DAC bottom plate sampling of the first analog input voltage on the first capacitors of the first MSBs sub-DAC and the first mismatch error shaping capacitor while the one or more second capacitors of the first LSB sub-DAC receive first mismatch error shaping code voltage values;

initiate second DAC bottom plate sampling of the second analog input voltage on the first capacitors of the second MSBs sub-DAC and the second mismatch error shaping capacitor while the one or more second capacitors of the second LSB sub-DAC receive second mismatch error shaping code voltage values;

end first and second DAC bottom plate sampling of the first and second analog input voltages;

initiate an injection phase in the first and second DACs by resetting the one or more second capacitors of the first and second LSB sub-DACs;

perform a differential comparison of the first and second DAC outputs to provide the differential comparison at the comparator output comparison output of a current SAR ADC conversion cycle;

perform a successive-approximation on the differential comparison to provide the digital value;

capture a current LSB result from the digital value for use in a subsequent SAR ADC conversion cycle; and perform mismatch error shaping on the digital value by subtracting, from the digital value, a LSB result captured from a previous SAR ADC conversion cycle.

21. The SAR ADC of claim 20, where the one or more first capacitors of the first and second MSBs sub-DACs and the one or more second capacitors of the first and second LSBs sub-DACs are each, respectively, encoded with one or more binary capacitors;

where the first DAC comprises a first termination capacitor coupled to the first LSBs sub-DAC; and where the second DAC comprises a second termination capacitor coupled to the second LSBs sub-DAC.

\* \* \* \* \*